(12) United States Patent
Mizusaki (10) Patent No.: US 10,527,750 B2
(45) Date of Patent: Jan. 7, 2020

(54) ELECTRONIC DEVICE

(71) Applicant: OMRON Corporation, Kyoto (JP)

(72) Inventor: Hiroyuki Mizusaki, Fukuchiyama (JP)

(73) Assignee: OMRON Corporation, Kyoto (JP)

( * ) Notice: Subject to any disclaimer, the term of this patent is extended or adjusted under 35 U.S.C. 154(b) by 111 days.

(21) Appl. No.: 15/814,418

(22) Filed: Nov. 16, 2017

(65) Prior Publication Data

US 2018/0239054 A1 Aug. 23, 2018

(30) Foreign Application Priority Data

Feb. 23, 2017 (JP) ................................ 2017-032290

(51) Int. Cl.
| | | |
|---|---|---|
| *G01V 8/12* | (2006.01) | |
| *H03K 17/945* | (2006.01) | |
| *G01P 1/02* | (2006.01) | |
| *H01H 50/02* | (2006.01) | |
| *H03K 17/94* | (2006.01) | |
| *H05K 5/00* | (2006.01) | |
| *H05K 7/14* | (2006.01) | |
| *H01B 3/30* | (2006.01) | |

(52) U.S. Cl.
CPC .................. *G01V 8/12* (2013.01); *G01P 1/02* (2013.01); *H01H 50/021* (2013.01); *H03K 17/941* (2013.01); *H03K 17/945* (2013.01); *H05K 5/006* (2013.01); *H05K 7/1417* (2013.01); *H01B 3/30* (2013.01); *H03K 2217/94094* (2013.01); *H03K 2217/960755* (2013.01)

(58) Field of Classification Search
CPC ...... G01V 8/12; H01H 50/021; H03K 17/941; H03K 17/945; H03K 2217/94094; H03K 2217/960755; G01P 1/02; H05K 7/1417; H05K 5/006; H01B 3/30
USPC .............................................. 250/559.3, 239
See application file for complete search history.

(56) References Cited

U.S. PATENT DOCUMENTS

| | | | | |
|---|---|---|---|---|
| 4,419,646 A | * | 12/1983 | Hermle .............. | H03K 17/9505 307/116 |
| 6,170,148 B1 | * | 1/2001 | Van Den Berg ....... | G01B 7/001 264/272.15 |
| 7,061,234 B2 | * | 6/2006 | Ohtsuki ............... | H03K 17/945 324/207.26 |

(Continued)

FOREIGN PATENT DOCUMENTS

| | | |
|---|---|---|
| CN | 203203610 | 9/2013 |
| CN | 203204171 | 9/2013 |

(Continued)

OTHER PUBLICATIONS

"Office Action of China Counterpart Application," with English translation thereof, dated Oct. 9, 2019, p. 1-p. 17.

*Primary Examiner* — Seung C Sohn
(74) *Attorney, Agent, or Firm* — JCIPRNET (57) ABSTRACT

To provide an electronic device which can be efficiently manufactured with stable quality. A photoelectric sensor 1A includes a cable 20 of which one end is drawn into a casing 10 through a cable insertion opening portion 10c, and a lead frame 25 which is electrically connected to a circuit board 34. A conductive wire 23 of the cable 20 is bonded to the lead frame 25, and an area from the cable insertion opening portion 10c to the bonded portion between the conductive wire 23 and the lead frame 25 is continuously sealed with resin R.

7 Claims, 7 Drawing Sheets

(56) References Cited

U.S. PATENT DOCUMENTS

| | | | | |
|---|---|---|---|---|
| 7,223,121 B2 * | 5/2007 | Moriyama | ............. | H01R 9/032 |
| | | | | 439/497 |
| 8,605,449 B2 * | 12/2013 | Bussa | ................... | F04B 49/007 |
| | | | | 361/736 |
| 2017/0290180 A1 * | 10/2017 | Kume | .................. | H02G 15/013 |

FOREIGN PATENT DOCUMENTS

| | | |
|---|---|---|
| CN | 104425925 | 3/2015 |
| JP | H0831282 | 2/1996 |

* cited by examiner

ELECTRONIC DEVICE

CROSS-REFERENCE TO RELATED APPLICATION

This application claims the priority benefit of Japanese application serial no. 2017-032290, filed on Feb. 23, 2017. The entirety of the above-mentioned patent application is hereby incorporated by reference herein and made a part of this specification.

BACKGROUND

Technical Field

Embodiments of the disclosure relate to an electronic device of which a cable is drawn to the outside.

Related Art

Conventionally, there is a case in which an electronic device of which a covered wire is exposed to the outside is used, for example, in an environment in which a temperature intensively changes over time and a large amount of liquid including oil such as cutting oil or chemicals with high corrosiveness is used. When the electronic device is used under such a relatively harsh environment, there is a case in which a liquid intruding into a gap between outer and inner sheaths of the covered wire or a gap between the inner sheath and a conductive wire intrudes into the electronic device due to a capillary action.

Figure 7:
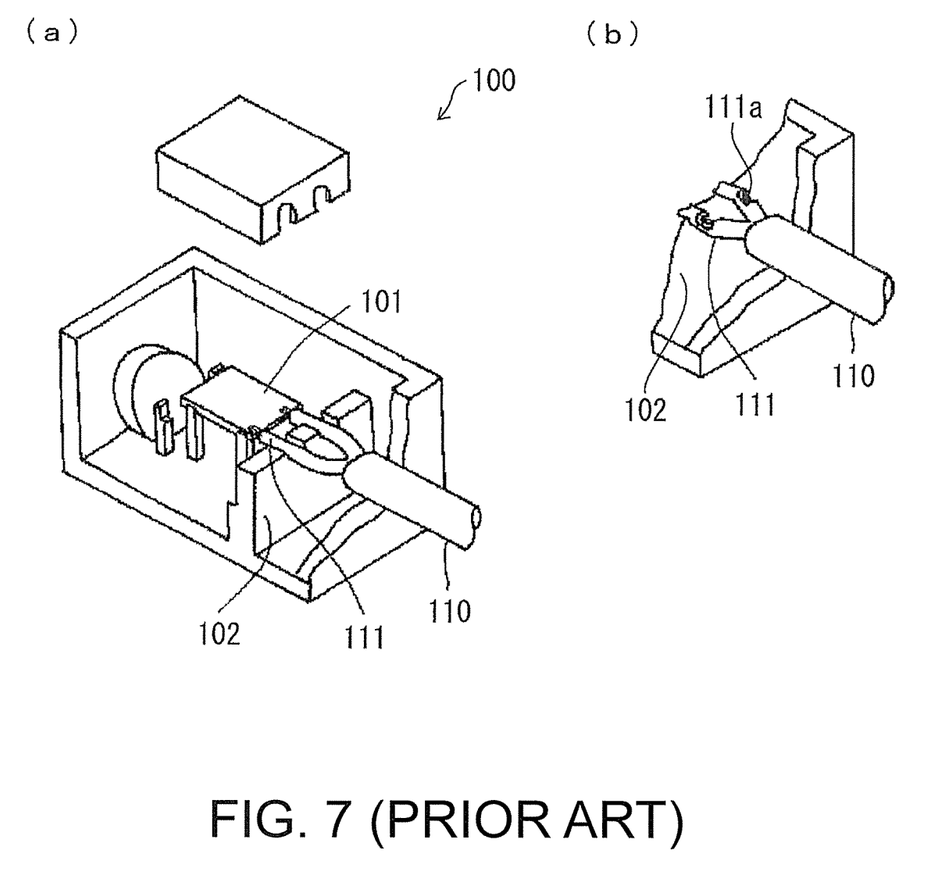

Here, in order to prevent the intrusion of the liquid into the electronic device due to the capillary action, for example, sealing structure of a proximity switch disclosed in Patent Document 1 (Japanese Unexamined Patent Application Publication No. H08-31282 (published on Feb. 2, 1996)) is known. In a proximity switch 100 disclosed in Patent Document 1, as shown in (a) of FIG. 7, a cable 110 is connected to a printed board 101 at a terminal portion 111. As shown in (b) of FIG. 7, a resin filled chamber 102 is provided in the proximity switch 100 and a core wire exposed portion 111a in which a part of an insulation coating is peeled off is provided in the terminal portion 111 of the cable 110 located at the resin filled chamber 102. Then, insulating resin is filled in the resin filled chamber 102 including the core wire exposed portion 111a.

Accordingly, since the insulation resin enters a gap between the core wires of the core wire exposed portion 111a and fills the gap, it is possible to prevent intrusion of other moistures or gases into the gap between the core wires of the cable 110.

SUMMARY

According to an aspect of the disclosure, there is provided an electronic device including: a casing which is provided with an opening portion; an electronic component which is accommodated in the casing; and a cable of which one end is drawn into the casing through the opening portion and the other end is drawn to the outside of the casing; and a relay connection member that is electrically connected to the electronic component, wherein a core wire of the cable at the one end is bonded to the relay connection member, and an area from the opening portion to the bonded portion between the core wire and the relay connection member is continuously sealed with resin.

BRIEF DESCRIPTION OF THE DRAWINGS

FIG. 1 in which (a) is a perspective view showing a connection portion structure of a covered wire of a photoelectric sensor of a first embodiment of the disclosure and FIG. 1 in which (b) is a cross-sectional view of a main part showing the connection portion structure of the covered wire of the photoelectric sensor.

FIG. 2 in which (a) is an exploded perspective view showing an overall configuration of the photoelectric sensor when viewed from an obliquely rear side which is a cable side and FIG. 2 in which (b) is an exploded perspective view showing an overall configuration of the photoelectric sensor when viewed from an obliquely front side.

FIG. 6 in which (a) is a perspective view showing a configuration of a lead frame and a main casing of a photoelectric sensor of a second embodiment of the disclosure, FIG. 6 in which (b) is a perspective view showing a structure of a connection portion of a cable and the lead frame when viewed from a rear side, and FIG. 6 in which (c) is a perspective view showing the structure of the connection portion of the cable and the lead frame when viewed from a front side.

FIG. 7 in which (a) is an overall perspective view showing a structure of a connection portion of a conventional covered wire and FIG. 7 in which (b) is a perspective view of a main part showing the structure of the connection portion of the conventional covered wire.

DESCRIPTION OF THE EMBODIMENTS

In the proximity switch disclosed in Patent Document 1, it is necessary to peel off a part of the insulation coating. An operation of peeling off a part of the insulation coating is performed by a worker. For that reason, it is difficult to efficiently and uniformly set a length of a portion in which the insulation coating has been peeled off. When the portion in which the insulation coating is peeled off is too long, a problem such as short-circuiting occurs. Meanwhile, when the portion is too short, sealing quality becomes poor.

An embodiment of the disclosure is to provide an electronic device which can be efficiently manufactured with stable quality.

According to the above-described embodiment, since an area from the opening portion to the bonded portion between the core wire and the relay connection member is continuously sealed with the resin, it is possible to prevent a problem in which the liquid intrudes into a portion at the inside of the bonded portion along a gap between the core wire and the insulation coating. In this configuration, the insulation coating of the cable may be peeled off to the end thereof. Therefore, the electronic device can be manufactured efficiently with stable quality.

In the electronic device, the relay connection member may be a member having a fixed shape.

According to the above-described configuration, since the relay connection member is prevented from contacting with other wires inside the casing, short-circuiting can be prevented.

In the electronic device, a sealing section which is partitioned by a partition wall and is adjacent to the opening portion may be provided inside the casing, and the sealing section may be provided with the bonded portion and may be filled with the resin.

According to the above-described configuration, since the sealing section provided with the bonded portion is filled with the resin, it is possible to more reliably prevent intrusion of the liquid into the casing.

In the electronic device, the cable may include a plurality of core wires, a plurality of the relay connection members may be provided to correspond to the plurality of core wires, and the electronic device may further include a holding member that has a plurality of holes through which the plurality of relay connection members pass and holds the plurality of relay connection members to be separated from each other.

According to the above-described configuration, since the plurality of relay connection members are held by the holding member to be separated from each other, short-circuiting inside the casing can be prevented.

In the electronic device, the cable may include a plurality of the core wires, a plurality of the relay connection members may be provided to correspond to the plurality of core wires, the electronic device may further include a holding member that has a plurality of holes through which the plurality of relay connection members pass and holds the plurality of relay connection members to be separated from each other, and the holding member may partition the sealing section inside the casing.

According to the above-described configuration, one end of the relay connection member can be easily disposed at the sealing section. Further, since the sealing section is divided by the holding member, it is possible to prevent the resin from leaking to the outside of the sealing section.

In the electronic device, the casing may be formed of metal.

When the core wire is wired to the electronic component inside the metallic casing, the possibility of short-circuiting increases. Meanwhile, according to the above-described configuration, the cable is electrically connected to the electronic component through the relay connection member inside the casing. For that reason, short-circuiting can be prevented.

The electronic device may be a photoelectric sensor or a proximity sensor.

The electronic device according to an aspect of the disclosure can be efficiently manufactured with stable quality.

First Embodiment

An embodiment of the disclosure will be described below with reference to FIGS. 1 to 5.

A configuration of a photoelectric sensor which is a sensor of the embodiment will be described below. Further, in the embodiment, the photoelectric sensor will be exemplified as an electronic device of which a covered wire (a cable) is drawn to the outside. However, the electronic device is not essentially limited to the photoelectric sensor. For example, various sensors such as a proximity sensor, a displacement sensor, a pressure sensor, an ultrasonic sensor, and a vibration sensor and other electronic devices which are not used for a sensing purpose can be employed. That is, the configuration of the embodiment can be applied to the electronic device of which the covered wire is drawn to the outside.

Here, the photoelectric sensor to be described in the embodiment is a sensor which detects the existence of an object or a change in surface state by using various properties of light. The photoelectric sensor includes a light projecting unit which emits light and a light receiving unit which receives light. When the transmitted light is interrupted or reflected by a detection object, the amount of light reaching the light receiving unit changes. The light receiving unit detects this change, converts the change into an electric signal, and outputs the electric signal to the outside. As the light to be used, visible light and infrared light are mainly used, but the disclosure is not limited thereto. Examples of the photoelectric sensor include, for example, a transmission type sensor, a reflection type sensor, and a regressive reflection type sensor. In the embodiment, for example, the reflection type photoelectric sensor will be described. However, a covered wire connection structure of the embodiment is not limited to the type of the photoelectric sensor.

Figure 2:
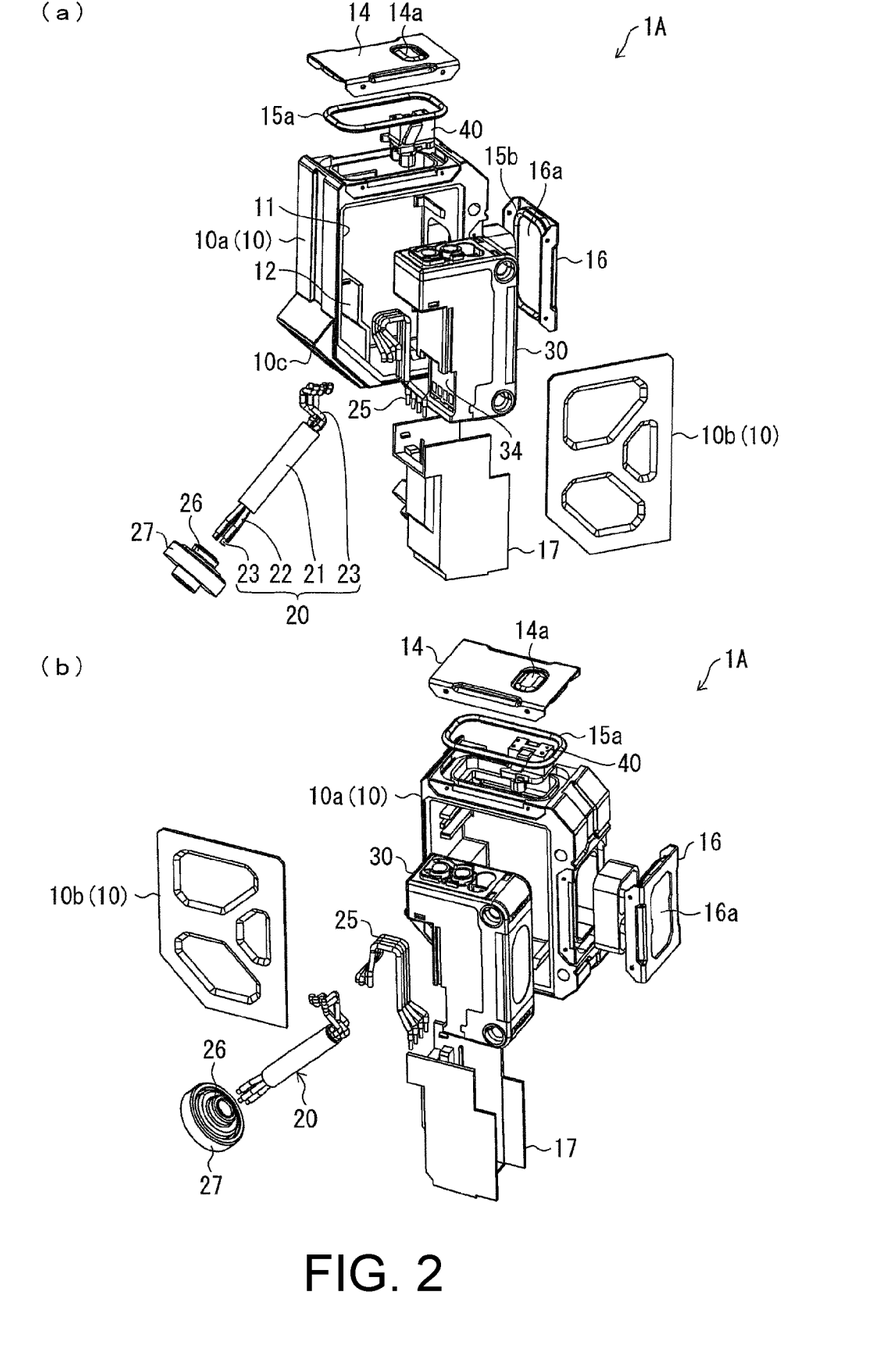

FIG. 2 in which (a) is an exploded perspective view showing an overall configuration of a photoelectric sensor 1A when viewed from an obliquely rear side which is near a cable 20. FIG. 2 in which (b) is an exploded perspective view showing an overall configuration of the photoelectric sensor 1A when viewed from an obliquely front side.

As shown in FIGS. 2(*a*) and 2(*b*), the photoelectric sensor 1A of the embodiment includes a casing 10 which includes a main casing 10*a* and a main cover 10*b*, a cable 20 which is drawn out from the casing 10 to be exposed to the outside, a sensing module 30 and a display unit 40 which are provided inside the casing 10, an insulation wall 17 which insulates the sensing module 30 from the casing 10, and a plurality of lead frames 25 (relay connection members) which electrically connect the cable 20 and the sensing module 30 (the electronic component) to each other.

The cable 20 includes a sheath 21 which is an outer sheath, a plurality of covering portions 22 which are inner sheaths, and a plurality of conductive wires 23 (core wires) which are respectively covered by the plurality of covering portions 22. The conductive wire 23 of the cable 20 is bonded to the corresponding lead frame 25 by soldering.

The casing 10 has, for example, a substantially rectangular parallelepiped shape having a component accommodation space portion 11 and a resin filling space portion 12. The casing 10 is provided with a partition wall 19. The component accommodation space 11 and the resin filling space portion 12 are partitioned by the partition wall 19 and the holding member 13.

A top surface display cover 14 is provided at a top surface of the main casing 10*a* of the casing 10 and the top surface display cover 14 is provided with a top surface light projecting member 14*a* provided at an opening. The top surface display cover 14 is formed as, for example, a metallic member and may be formed as a stainless steel member. The top surface display cover 14 is manufactured by pressing, for example, a metal plate.

An O-ring 15*a* is interposed between the top surface display cover 14 and the main casing 10*a*. Accordingly, the component accommodation space 11 inside the main casing 10*a* is sealed from an external space. In addition, the top surface display cover 14 is fixed to the main casing 10*a* by, for example, laser welding.

Further, a front surface of the main casing 10*a* is provided with a front surface cover 16 having a front surface light projecting plate 16*a* in an opening.

The front surface cover 16 is forming as, for example, a metallic member and may be formed as a stainless steel member. The front surface cover 16 is manufactured by pressing, for example, a metal plate.

An O-ring 15*b* is interposed between the front surface cover 16 and the main casing 10*a*. Accordingly, the component accommodation space 11 inside the main casing 10a is sealed from an external space. In addition, the front surface cover 16 is fixed to the main casing 10a by, for example, laser welding.

The cable 20 is inserted into the casing 10 at the rear side of the main casing 10a. Additionally, in the embodiment, a light emitting side of a light projecting unit 31 and a light receiving side at a light receiving unit 32 to be described later will be described as a front side of the casing 10.

The main cover 10b is fixed to the main casing 10a by, for example, laser welding over the entire periphery of the peripheral edge.

Both the main casing 10a and the main cover 10b are formed as, for example, metallic member of stainless steel or the like. The main casing 10a is manufactured by, for example, metal injection molding (MIM) and the main cover 10b is manufactured by pressing, for example, a metal plate.

A cable insertion opening portion 10c (an opening portion) having a circular cross-section is provided at the lower surface of the rear side of the main casing 10a and one end of the cable 20 is inserted into the cable insertion opening portion 10c. The cable insertion opening portion 10c is sealed by a cylindrical bush 26 and a fixed member 27.

The bush 26 is formed as, for example, a rubber member and may be formed of any one of nitrile rubber (NBR), hydrogenated nitrile rubber (HNBR), and fluorine-based rubber. In addition, the bush does not need to be formed of rubber and various materials such as plastic can be used as long as a gap between the cable 20 and the casing 10 can be sealed.

The fixed member 27 has an annular shape and is formed as, for example, a metallic member of true weave or the like. The fixed member 27 includes the bush 26 and is fitted into the cable insertion opening portion 10c of the main casing 10a. The fixed member 27 fixes the bush 26 and the cable 20. Accordingly, the sealing property of the component accommodation space 11 of the casing 10 is kept.

Figure 3:
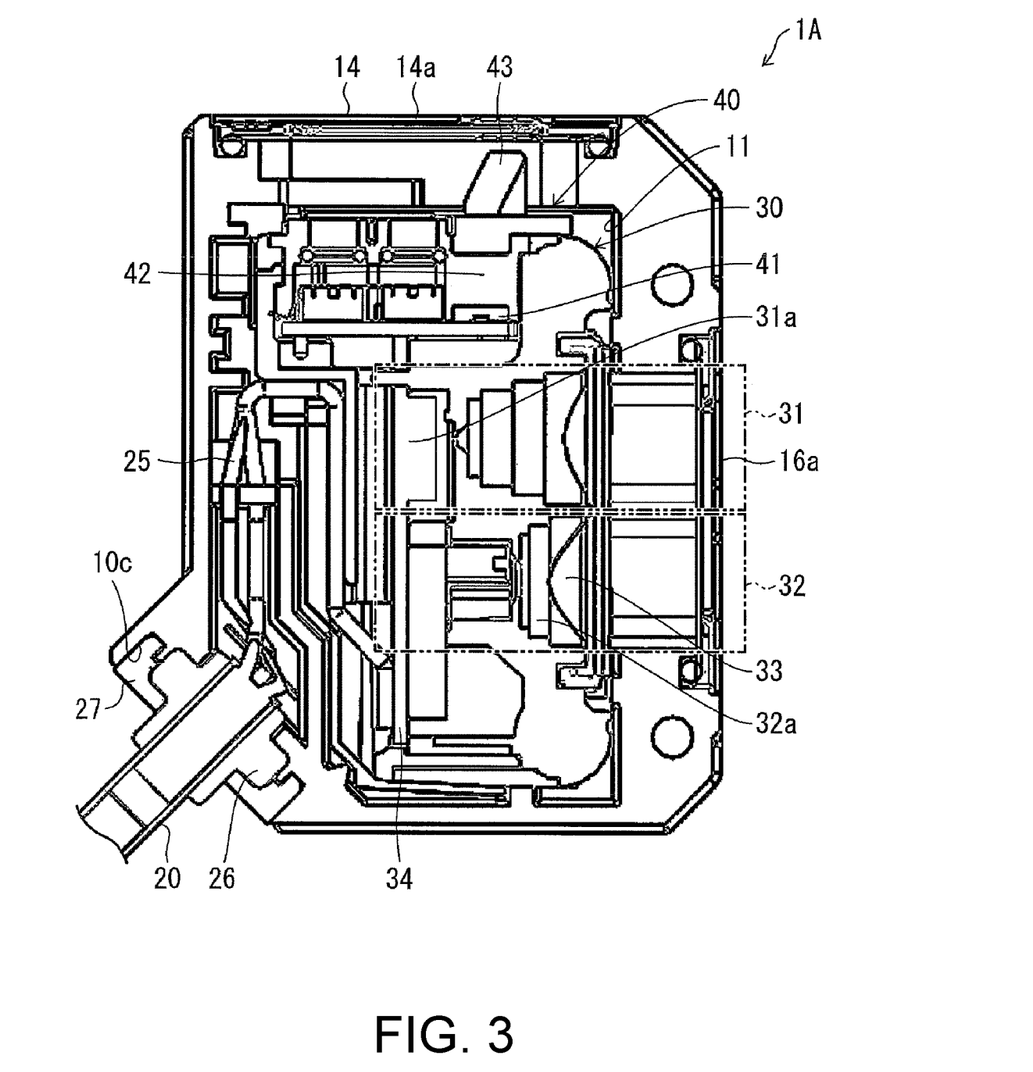
FIG. 3 is a cross-sectional view showing an overall configuration of the photoelectric sensor.

FIG. 3 is a cross-sectional view showing an overall configuration of the photoelectric sensor 1A. As shown in FIG. 3, in the component accommodation space 11 inside the main casing 10a of the photoelectric sensor 1A, the sensing module 30 is accommodated at the center and the display unit 40 is provided at the upper portion. The sensing module 30 includes the light projecting unit 31, the light receiving unit 32, and a circuit board 34 (an electronic component).

The light projecting unit 31 includes a light emitting element 31a which is a light source, a light projecting and receiving integrated lens 33, the front surface light projecting plate 16a, and a light projecting circuit formed on the circuit board 34.

The light receiving unit 32 includes a light receiving element 32a, the light projecting and receiving integrated lens 33, the front surface light projecting plate 16a, and a light receiving circuit formed on the circuit board 34.

As shown in FIG. 3, the display unit 40 is provided above the sensing module 30. The display unit 40 includes a display LED 41 which is configured as a light emitting diode (LED) or the like, a display operation unit (not shown) which includes a sensitivity adjustment volume, an operation selection switch, and the like, and a display operation circuit board (not shown) equipped with various electronic components constituting a display output unit and an operation unit. The display operation circuit board is electrically connected to the circuit board 34 by a wire (not shown).

A transparent member 42 and a light guiding member 43 are provided above the display LED 41 and light turned on by the display LED 41 is emitted to the outside through the transparent member 42, the light guiding member 43, and the top surface light projecting member 14a of the top surface display cover 14. In addition, the top surface light projecting member 14a is formed as a member that diffuses light so that the light emitted from the display LED 41 is visible from the outside.

Figure 4:
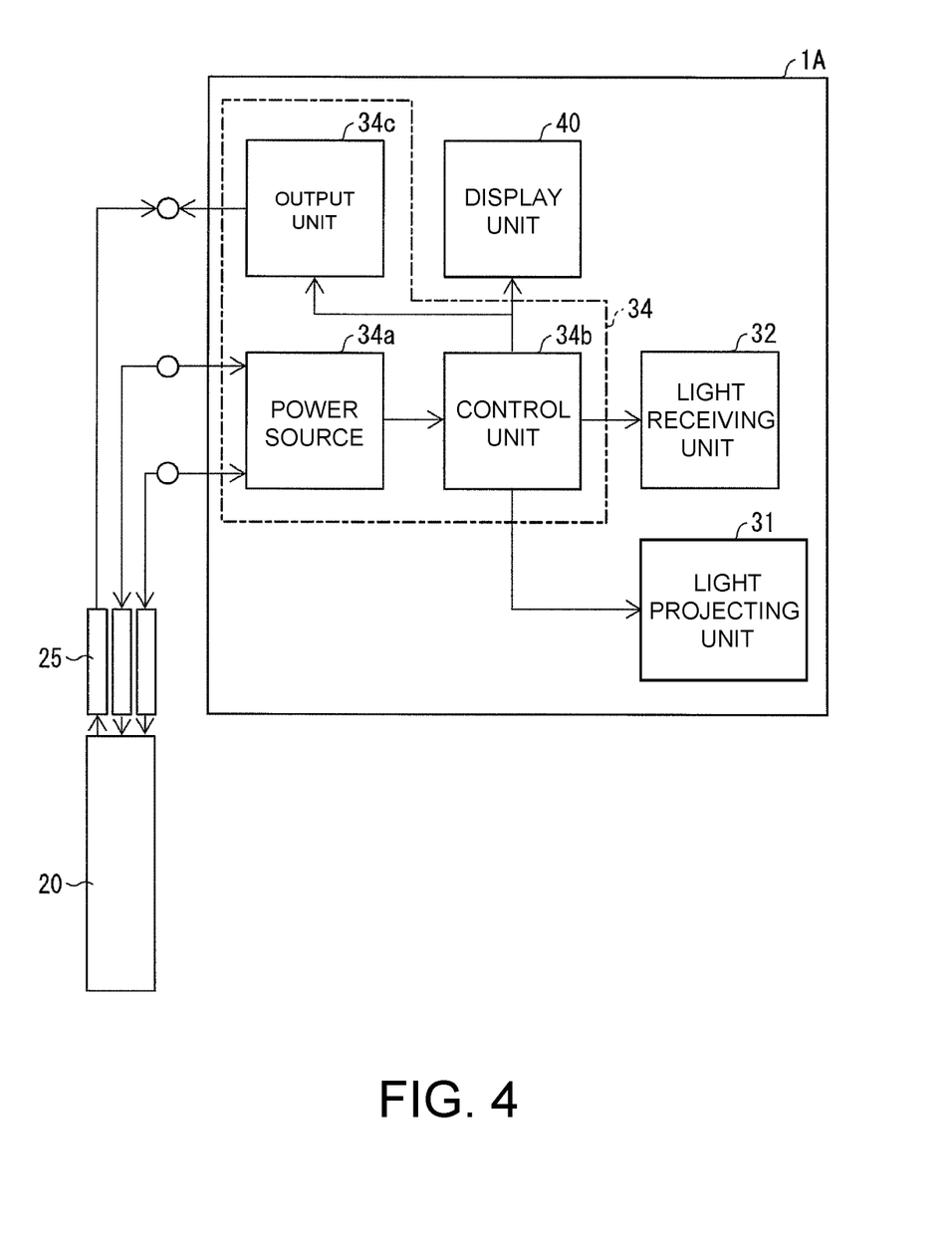
FIG. 4 is a block diagram showing a configuration of a control system of the photoelectric sensor.

FIG. 4 is a block diagram showing a configuration of a control system of the photoelectric sensor 1A. As shown in FIG. 4, the circuit board 34 which is a component of a control system of the photoelectric sensor 1A of the embodiment includes a power source 34a, a control unit 34b, and an output unit 34c. The power source 34a supplies electric power supplied by the cable 20 to the control unit 34b, the output unit 34c, the light projecting unit 31, the light receiving unit 32, and the display unit 40.

The control unit 34b includes a CPU and other circuits. The control unit 34b detects a sensor signal input to the light receiving unit 32 and displays a detection result on the display unit 40 by controlling the light projecting unit 31 and the light receiving unit 32 and transmits a signal indicating the detection result to the outside through the cable 20 by controlling the output unit 34c.

In the above-described photoelectric sensor 1A, for example, a laser beam is emitted by the light emitting element 31a of the light projecting unit 31. The laser beam is emitted to the outside through the light projecting and receiving integrated lens 33 and the front surface light projecting plate 16a, is reflected by a detection object (not shown), and is returned to the sensing module 30. In the sensing module 30, this reflected light is received by the light receiving element 32a through the front surface light projecting plate 16a and the light projecting and receiving integrated lens 33. In the circuit board 34, an electric signal having strength corresponding to the light receiving amount of the reflected light is generated. Accordingly, the photoelectric sensor 1A detects the existence of an object based on the electric signal or outputs a signal indicating the light receiving amount of the photoelectric sensor 1A. The output is performed by the display unit 40 and is transmitted to the outside by the output unit 34c.

(Cable Connection Portion Structure of Photoelectric Sensor)

A connection portion structure of the cable 20 of the photoelectric sensor 1A in the above-described configuration will be described below.

For example, the photoelectric sensor is sometimes used in an environment in which a large amount of liquid including oil such as cutting oil or chemicals with high corrosiveness is used. In this case, there is a case in which a liquid intrudes into a gap between the sheath corresponding to the outer sheath and the covering portion corresponding to the inner sheath or a gap between the conductive wires corresponding to the core wires of the covering portion in accordance with deterioration of the covering portion and the sheath of the cable. In some cases, the liquid intruding into the cable intrudes into the casing along the cable due to a capillary action.

Here, in order to prevent the intrusion of the liquid into the electronic device due to the capillary action, for example, a method of providing a core wire exposed portion obtained by peeling off a part of an insulation coating and sealing the portion with insulation resin is employed in the related art. Accordingly, a sealing property is ensured for the liquid intruding along the inner sheath and the conductive wire.

However, in this method, since there are many processes depending on manual work at the time of peeling off a part of the insulation coating, a problem arises in that a variation in sealing quality is large and the photoelectric sensor fails within a short time. Specifically, there is a possibility of short-circuiting when the insulation coating is largely peeled off and the intrusion of the liquid cannot be sufficiently prevented when the insulation coating is peeled off just a little.

Here, the photoelectric sensor 1A of the embodiment has a connection portion structure of the cable 20 as follows.

Figure 1:
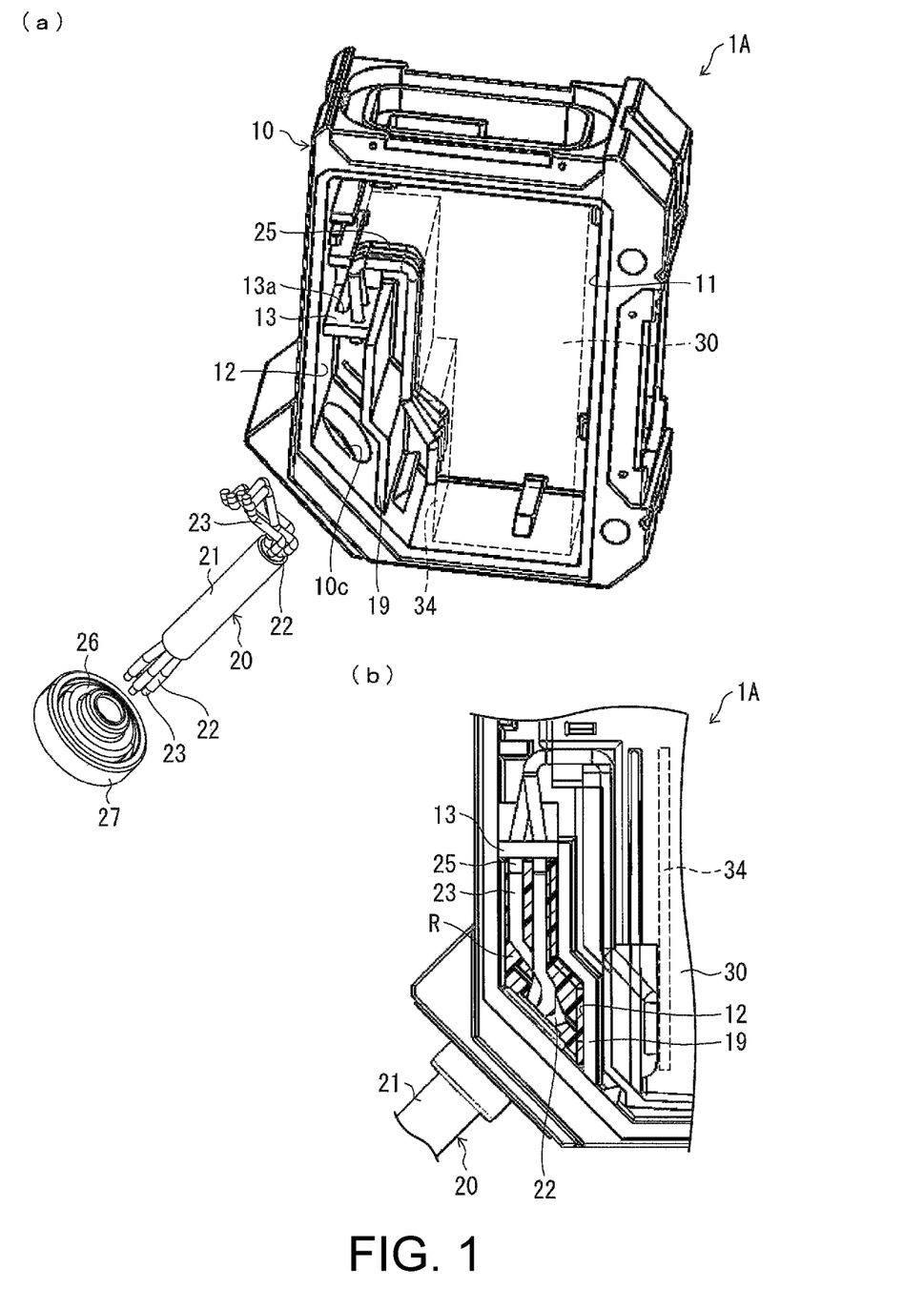

FIG. 1 in which (a) is a perspective view showing a connection portion structure of the cable 20 of the photoelectric sensor 1A of the embodiment. FIG. 1 in which (b) is a cross-sectional view of a main part showing a connection portion structure of the cable 20 of the photoelectric sensor 1A.

As shown in FIG. 1, in the photoelectric sensor 1A of the embodiment, the cable 20 passes though the cable insertion opening portion 10c and the bush 26. One end of the cable 20 is drawn into the casing 10 and is disposed inside the resin filling space portion 12 (the sealing section). The other end of the cable 20 is drawn to the outside of the casing 10. In the casing 10, the plurality of covering portions 22 and the sheath 21 of one end of the cable 20 are peeled off.

The holding member 13 is an insulation member and includes a plurality of through-holes 13a (holes) corresponding to the plurality of lead frames 25. The holding member 13 is disposed to contact the partition wall 19 and covers the resin filling space portion 12. The holding member 13 holds the plurality of lead frames 25 to be separated from each other.

The lead frame 25 is a conductive member of which a shape is fixed. The lead frame 25 does not have flexibility (has rigidity). One end of the lead frame 25 is electrically connected to an external connection terminal (not shown) of the circuit board 34 by soldering or laser welding. The other end of the lead frame 25 is bent and is disposed inside the resin filling space portion 12 through the through-hole 13a provided in the holding member 13. The other end of the lead frame 25 is bonded to the conductive wire 23 in the resin filling space portion 12 by soldering or laser welding.

The resin filling space portion 12 is filled with the resin R. The resin R continuously covers an area from the cable insertion opening portion 10c to at least the bonded portion between the conductive wire 23 and the lead frame 25 to seal the area. Here, the resin R covers the bonded portion between the lead frame 25 and the conductive wire 23 exposed from the covering portion 22 inside the resin filling space portion 12. Further, the resin R seals a gap among the cable insertion opening portion 10c, the bush 26, and the cable 20. The resin R seals a gap between the lead frame 25 and the through-hole 13a of the holding member 13 and a gap among the holding member 13, the casing 10, and the partition wall 19. As the resin R, for example, insulation resin such as epoxy resin can be used.

The conductive wire 23 is bonded to the lead frame 25 and the bonded portion is sealed with the resin R. The bonded portion is not covered at the covering portion 22 and the resin R directly contacts the conductive wire 23 and the lead frame 25. The resin R continuously seals an area from the cable insertion opening portion 10c to the bonded portion. Accordingly, even when a liquid rises to the inside of the casing 10 along a gap between the covering portion 22 and the conductive wire 23 by the capillary action, the liquid cannot intrude into a portion at the inside of the bonded portion between the conductive wire 23 and the lead frame 25. Therefore, it is possible to prevent the intrusion of the liquid into the component accommodation space 11.

Further, the plurality of lead frames 25 are held by the holding member 13 to be separated from each other. Each of the plurality of lead frames 25 is a member that has a fixed shape and has no flexibility. For that reason, it is possible to prevent a contact with other wires in the component accommodation space 11 or a contact between the lead frames 25. Therefore, it is possible to electrically connect the conductive wire 23 and the circuit board 34 to each other by disposing the plurality of lead frames 25 in a narrow space. The lead frame 25 may not be covered by an insulation body.

(Method of Assembling Photoelectric Sensor)

A method of assembling the photoelectric sensor 1A having a connection portion of the cable 20 will be described below.

Figure 5:
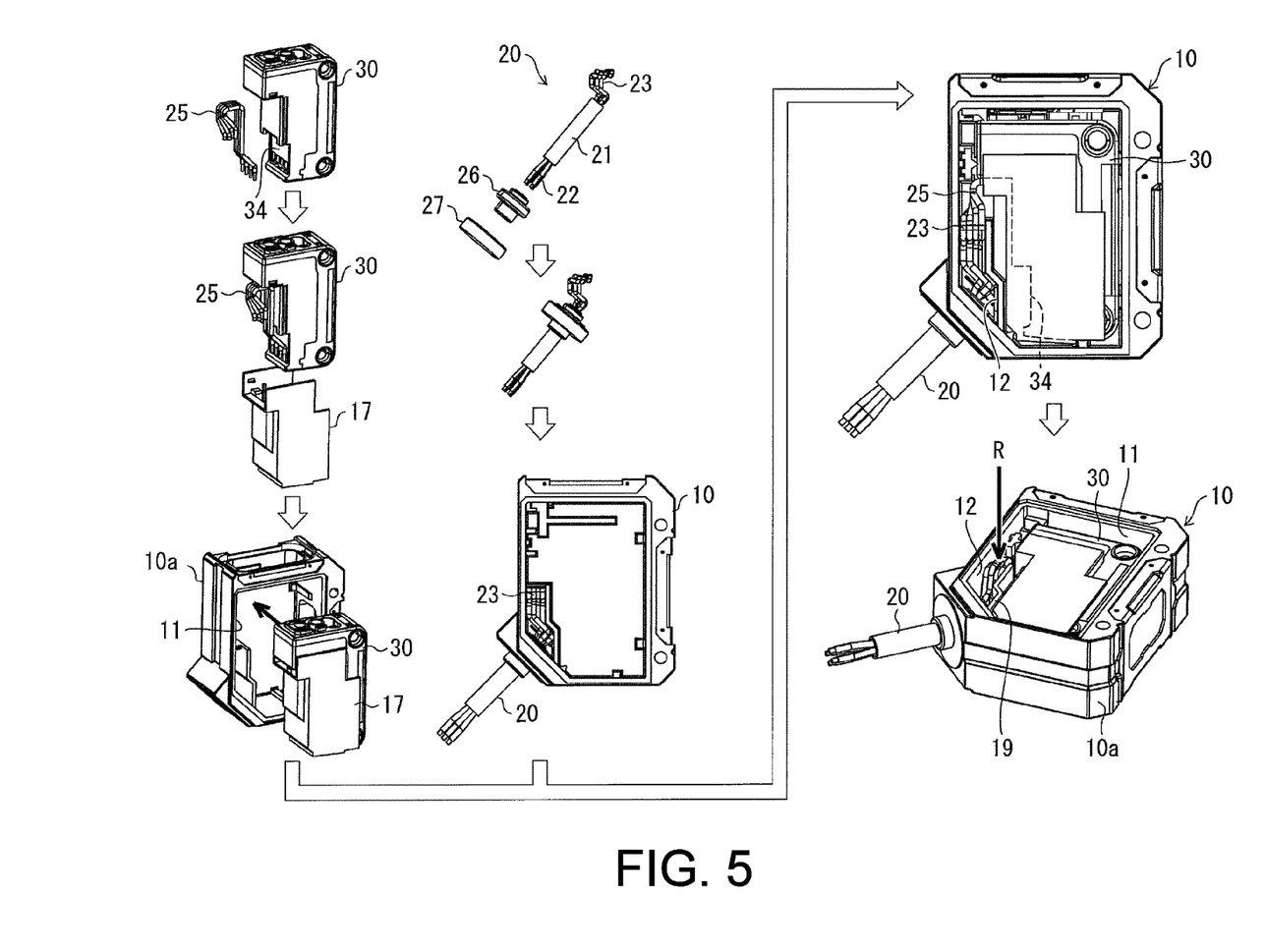
FIG. 5 is a perspective view showing a method of assembling the photoelectric sensor.

FIG. 5 is a perspective view showing a method of assembling the photoelectric sensor 1A. As shown in FIG. 5, the sheath 21 and the covering portion 22 of the distal end at the connection side to the circuit board 34 in the cable 20 are peeled off in order to assemble the photoelectric sensor 1A of the embodiment.

The cable 20 passes through the cable insertion opening portion 10c and the bush 26. One end of the cable 20 is drawn into the casing 10 and is disposed inside the resin filling space portion 12 (the sealing section). The other end of the cable 20 is drawn to the outside of the casing 10. Inside the casing 10, the sheath 21 and the plurality of covering portions 22 of one end of the cable 20 are peeled off and the plurality of conductive wires 23 are exposed. The fixed member 27 is press-inserted into the cable insertion opening portion 10c. Accordingly, the sealing property of the cable insertion opening portion 10c is improved.

Meanwhile, as shown in FIG. 5, one end of the lead frame 25 is connected to the circuit board 34 of the sensing module 30 by soldering or laser welding. Next, the sensing module 30 having the lead frame 25 soldered thereto is covered by the insulation wall 17. In the embodiment, the insulation wall 17 is a casing which covers the outside of the sensing module 30 having the lead frame 25 soldered thereto. The other end of the lead frame 25 is exposed from the insulation wall 17. The insulation wall 17 insulates the lead frame 25 from the metallic casing 10 and the partition wall 19. The other end of the lead frame 25 of which one end is bonded to the circuit board 34 of the sensing module 30 is inserted through the through-hole 13a of the holding member 13. Then, the sensing module 30 having the insulation wall 17 attached thereto is accommodated into the component accommodation space 11 of the main casing 10a having the cable 20 attached thereto from the lateral side. The holding member 13 and the partition wall 19 partition the resin filling space portion 12. The resin filling space portion 12 is adjacent to the cable insertion opening portion 10c. The other end of the lead frame 25 is disposed inside the resin filling space portion 12.

In the resin filling space portion 12, the lead frames 25 facing the corresponding conductive wires 23 are connected thereto by soldering, laser welding, or the like.

Finally, the main casing 10a is laid sideways and the resin filling space portion 12 is filled with the resin R such as an epoxy resin. When the main cover 10b is attached to the main casing 10a after the resin R is cured, the photoelectric sensor 1A is completed.

Second Embodiment

Another embodiment the disclosure will be described below with reference to FIG. 6. Additionally, configurations other than those described in the embodiment are the same as those in the first embodiment. Further, for convenience of description, members having the same functions as the members shown in the drawings of the first embodiment are denoted by the same reference numerals and the description thereof is omitted.

In the photoelectric sensor 1A of the first embodiment, the conductive wire 23 of the cable 20 is directly connected to the lead frame 25. In contrast, a photoelectric sensor 1B of the embodiment has a different configuration in which the conductive wire 23 is electrically connected to the lead frame 25 through a mold interconnect device (MID) 18.

Figure 6:
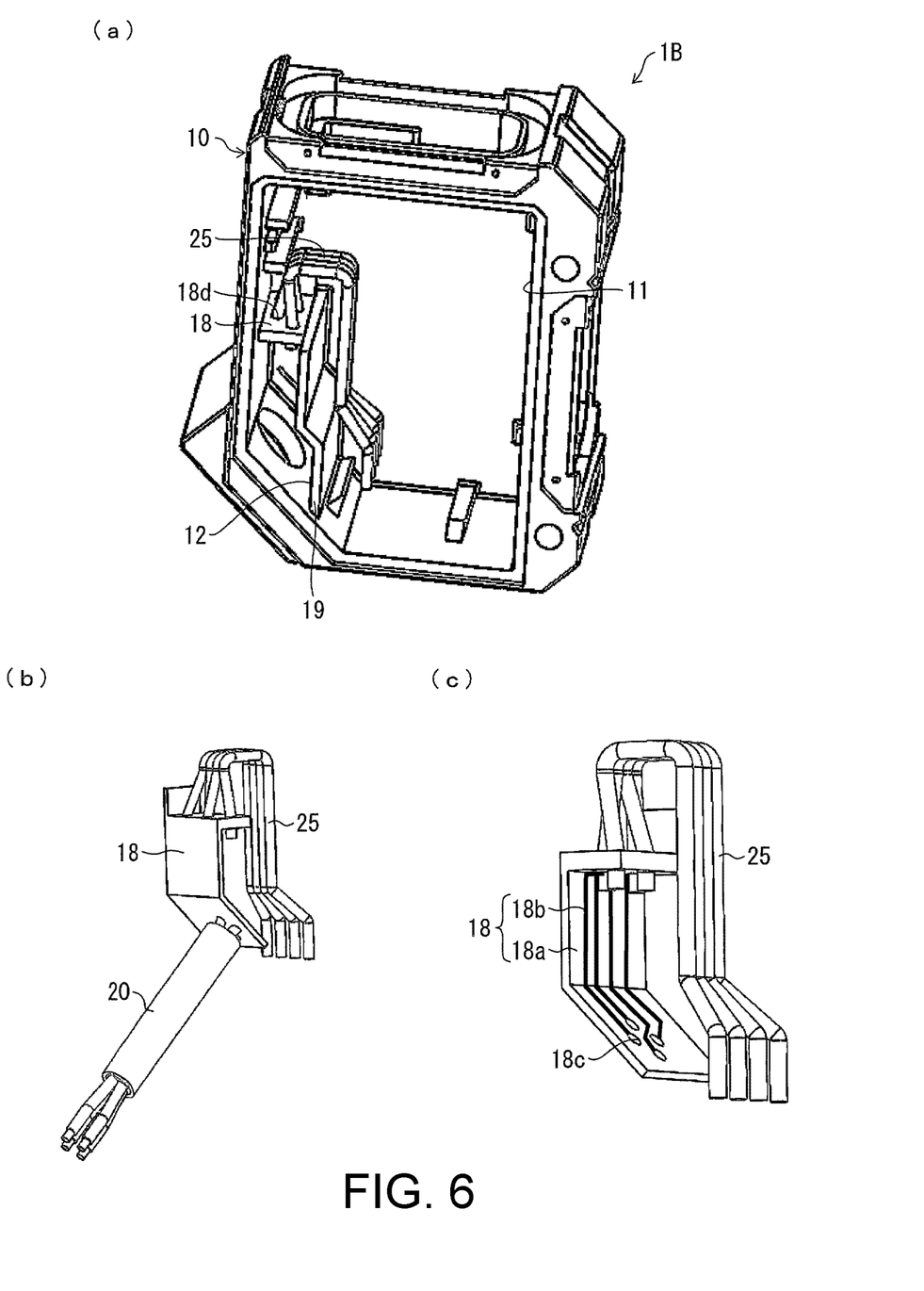

FIG. 6 in which (a) is a perspective view showing a configuration of the casing 10 and the lead frame 25 of the photoelectric sensor 1B of the embodiment. Here, the sensing module 30 is not shown in the drawings. FIG. 6 in which (b) is a perspective view showing a connection portion structure between the lead frame 25 and the cable 20 when viewed from the rear side. FIG. 6 in which (c) is a perspective view showing a structure including the lead frame 25 and the mold interconnect device 18 when viewed from the front side.

The mold interconnect device 18 (the relay connection member or the holding member) is formed such that an electric circuit, an electrode, or a wiring pattern is formed on a resin injection-molded product. In the embodiment, the mold interconnect device 18, for example, has a configuration in which a resin portion 18a (a holding member) having a substantially L-shaped cross-section and a plurality of metallic patterns 18b (relay connection members) are integrally formed by injection-molding. The mold interconnect device 18 includes a plurality of through-holes 18c which correspond to the plurality of conductive wires 23 and a plurality of through-holes 18d which correspond to the plurality of lead frames 25. The plurality of metallic patterns 18b are respectively formed to electrically connect the corresponding through-holes 18d to the through-holes 18c. The plurality of lead frames 25 are respectively connected to the metallic patterns 18b of the mold interconnect device 18 by soldering or the like while passing through the through-holes 18d. The plurality of conductive wires 23 are respectively inserted through the through-holes 18c and are connected to the metallic patterns 18b of the mold interconnect device 18 by soldering or the like. In this way, the plurality of conductive wires 23 are electrically connected to the circuit board 34 through the mold interconnect device 18 and the lead frame 25.

A part of the mold interconnect device 18 partitions the resin filling space portion 12 along with the partition wall 19. The resin filling space portion 12 is filled with the resin R. The bonded portion (the position of the through-hole 18c) between the conductive wire 23 and the mold interconnect device 18 and the bonded portion (the position of the through-hole 18d) between the mold interconnect device 18 and the lead frame 25 are sealed with the resin R. When the main cover 10b is attached to the main casing 10a after the resin R of the resin filling space portion 12 is cured, the photoelectric sensor 1B is completed.

In the photoelectric sensor 1B of the embodiment, the plurality of metallic patterns of the mold interconnect device 18 are held by the resin portion 18a to be separated from each other. For that reason, short-circuiting can be prevented even when the plurality of conductive wires 23 and the circuit board 34 are electrically connected in a narrow space. Further, the assembly can be easily performed.

Modified Example

Further, in the second embodiment, the lead frame 25 is connected to the mold interconnect device 18. However, an aspect of the disclosure is not essentially limited thereto. For example, it is possible to substitute the lead frame with the mold interconnect device. In this case, the mold interconnect device having the metallic pattern is bonded to the circuit board. Accordingly, when the conductive wire is soldered to the metallic pattern of the mold interconnect device, it is possible to prevent the liquid from intruding into a portion at the inside of the metallic pattern.

Further, a fixed component or a harness of which a shape is fixed by resin or the like may be used instead of the plurality of lead frames 25. Since the shape of the harness is fixed and the wires are covered, short-circuiting inside the casing 10 can be prevented. The plurality of conductive wires 23 are connected to the harness.

Further, the disclosure is not limited to the above-described embodiments, various modifications can be made within the scope of claims, and embodiments obtained by an appropriate combination of technical means respectively disclosed in other embodiments are also included in the technical scope of the disclosure.

What is claimed is:

1. An electronic device comprising:
   a casing which is provided with an opening portion;
   an electronic component which is accommodated in the casing;
   a cable of which one end is drawn into the casing and the other end is drawn to the outside of the casing through the opening portion; and
   a relay connection member that is disposed inside the casing and electrically connected to the electronic component,
   wherein a core wire of the cable at the one end is bonded to the relay connection member, and
   wherein an area from the opening portion to a bonded portion between the core wire and the relay connection member is continuously sealed by resin.

2. The electronic device according to claim 1,
   wherein the relay connection member is a member having a fixed shape.

3. The electronic device according to claim 1,
   wherein a sealing section which is partitioned by a partition wall and is adjacent to the opening portion is provided inside the casing, and
   wherein the sealing section is provided with the bonded portion and is filled with the resin.

4. The electronic device according to claim 1,
   wherein the cable includes a plurality of the core wires,
   wherein a plurality of the relay connection members are provided to correspond to the plurality of core wires, and
   wherein the electronic device further comprises a holding member that has a plurality of holes through which the plurality of relay connection members pass and holds the plurality of relay connection members to be separated from each other.

5. The electronic device according to claim 3,
   wherein the cable includes a plurality of the core wires,
   wherein a plurality of the relay connection members are provided to correspond to the plurality of core wires,
   wherein the electronic device further comprises a holding member that has a plurality of holes through which the plurality of relay connection members pass and holds the plurality of relay connection members to be separated from each other, and
   wherein the holding member partitions the sealing section inside the casing.

6. The electronic device according to claim 1, wherein the casing is metal.

7. The electronic device according to claim 1, wherein the electronic device is a photoelectric sensor or a proximity sensor.

* * * * *